(12) United States Patent
Tutat et al.

(10) Patent No.: US 10,071,880 B2
(45) Date of Patent: Sep. 11, 2018

(54) LOW PROFILE DRIVE UNIT FOR ELEVATOR SYSTEM

(71) Applicant: OTIS ELEVATOR COMPANY, Farmington, CT (US)

(72) Inventors: Andreas Tutat, Berlin (DE); Ibrahim Ia Atalmis, Berlin (DE); Herbert Horbrügger, Berlin (DE); Marvin Dehmlow, Berlin (DE)

(73) Assignee: OTIS ELEVATOR COMPANY, Farmington, CT (US)

( * ) Notice: Subject to any disclaimer, the term of this patent is extended or adjusted under 35 U.S.C. 154(b) by 434 days.

(21) Appl. No.: 14/768,526

(22) PCT Filed: Feb. 21, 2013

(86) PCT No.: PCT/US2013/027036
§ 371 (c)(1),
(2) Date: Aug. 18, 2015

(87) PCT Pub. No.: WO2014/130030
PCT Pub. Date: Aug. 28, 2014

(65) Prior Publication Data
US 2016/0039633 A1 Feb. 11, 2016

(51) Int. Cl.
*B66B 1/06* (2006.01)
*B66B 1/30* (2006.01)
(Continued)

(52) U.S. Cl.
CPC ............. *B66B 1/302* (2013.01); *B66B 1/306* (2013.01); *B66B 1/308* (2013.01); *B66B 11/002* (2013.01);
(Continued)

(58) Field of Classification Search
CPC ......... B66B 1/302; B66B 1/306; B66B 1/308; B66B 1/02; H01H 71/10; Y02B 50/127;
(Continued)

(56) References Cited

U.S. PATENT DOCUMENTS 5,429,211 A * 7/1995 Aulanko ............... B66B 11/002
187/254
5,490,578 A * 2/1996 Aulanko ............. B66B 11/0045
187/254
(Continued)

FOREIGN PATENT DOCUMENTS

CN  1774384 A  5/2006
CN  101146729 A  3/2008
(Continued)

OTHER PUBLICATIONS

Chinese Office Action and search report for application CN 201380073637, dated Aug. 29, 2016, 7 pages.
(Continued)

*Primary Examiner* — Anthony Salata
(74) *Attorney, Agent, or Firm* — Cantor Colburn LLP

(57) ABSTRACT

A drive unit for an elevator system, the drive unit including a multilayer, power circuit board; a first DC link formed in a layer of the power circuit board; a second DC link formed in a layer of the power circuit board; a first switch having a first terminal, the first switch mounted to a surface of the power circuit board; a first via electrically coupling the first terminal to the first DC link; a second switch having a second terminal, the second switch mounted to the surface of the power circuit board; and a second via electrically coupling the second terminal to the second DC link; the first via conducting heat from the first switch to the first DC link; the second via conducting heat from the second switch to the second DC link.

26 Claims, 7 Drawing Sheets

(51) Int. Cl.
 B66B 11/00 (2006.01)
 H01H 71/10 (2006.01)
 H05K 1/02 (2006.01)
(52) U.S. Cl.
 CPC ........... *H01H 71/10* (2013.01); *H05K 1/0265* (2013.01); *H05K 1/0206* (2013.01); *H05K 2201/10166* (2013.01); *H05K 2201/10416* (2013.01); *Y02B 50/127* (2013.01)
(58) Field of Classification Search
 CPC ............... H05K 1/0265; H05K 1/0206; H05K 2201/10166; H05K 2201/10416
 USPC ....... 187/247, 277, 288, 289, 290, 291, 293, 187/296, 297, 391–393; 318/362, 375, 318/376, 801–815; 363/34, 40, 50; 361/600, 627, 679.46, 690, 697, 702, 718, 361/720, 736
 See application file for complete search history.

(56) References Cited

U.S. PATENT DOCUMENTS

| | | | |
|---|---|---|---|
| 5,835,356 A | | 11/1998 | Wieloch et al. |
| 6,050,368 A | | 4/2000 | Pakarinen et al. |
| 6,148,962 A | * | 11/2000 | Hakala ................ B66B 11/0045 187/254 |
| 7,104,363 B2 | * | 9/2006 | Mori .................... B66B 1/30 187/290 |
| 8,109,367 B2 | * | 2/2012 | Ach .................... B66B 11/0045 187/266 |
| 8,127,894 B2 | | 3/2012 | Agirman et al. |
| 9,272,880 B2 | * | 3/2016 | Ericson ................ B66B 11/002 |
| 9,573,791 B2 | * | 2/2017 | Garcia ................ B66B 11/0005 |
| 9,815,665 B2 | * | 11/2017 | Rogers .................... B66B 7/00 |
| 2007/0137945 A1 | | 6/2007 | Takasaki et al. |
| 2011/0061976 A1 | * | 3/2011 | Tiner .................. B66B 11/0461 187/254 |
| 2014/0166408 A1 | * | 6/2014 | Rogers ................. B66B 19/005 187/276 |
| 2015/0314984 A1 | * | 11/2015 | McCarthy ............... H02J 7/025 187/413 |

FOREIGN PATENT DOCUMENTS

| | | |
|---|---|---|
| CN | 101830382 A | 9/2010 |
| JP | 2007261758 A | 10/2007 |
| JP | 4804020 B2 | 10/2011 |
| WO | 9836489 A1 | 8/1998 |

OTHER PUBLICATIONS

Supplemental European Search Report for application EP 13875607, dated Oct. 7, 2016, 7 pages.
International Search Report for application PCT/US2013/027036 dated Nov. 6, 2013, 4 pages.
International Search Report for application PCT/US2013/027036 dated Nov. 6, 2013, 5 pages.

\* cited by examiner

LOW PROFILE DRIVE UNIT FOR ELEVATOR SYSTEM

FIELD OF INVENTION

The subject matter disclosed herein relates generally to the field of elevator systems, and more particularly, to a low profile drive unit for an elevator system.

BACKGROUND

Elevator systems typically include a drive unit having a controller and various power electronics. The drive unit generates drive signals for a machine that imparts movement to an elevator car. Existing elevator systems may include a machine room at an upper section of a hoistway where the drive unit is positioned. More recent elevator systems have eliminated the machine room to save building space. These machine room-less elevator systems mount the drive unit where space is available. Existing elevator systems position the drive unit within a wall at one of the elevator landings. Positioning the drive unit within a wall requires that the wall at the particular landing be specially constructed with a recess to accept the drive unit, support elements, access panels, etc. Customization of one wall to receive the drive unit adds to the cost of building construction.

BRIEF SUMMARY

According to an exemplary embodiment, a drive unit for an elevator system, includes a multilayer, power circuit board; a first DC link formed in a layer of the power circuit board; a second DC link formed in a layer of the power circuit board; a first switch having a first terminal, the first switch mounted to a surface of the power circuit board; a first via electrically coupling the first terminal to the first DC link; a second switch having a second terminal, the second switch mounted to the surface of the power circuit board; and a second via electrically coupling the second terminal to the second DC link; the first via conducting heat from the first switch to the first DC link; the second via conducting heat from the second switch to the second DC link.

According to another exemplary embodiment, an elevator system includes an elevator car to travel along a hoistway, the elevator car distanced from a hoistway wall by a gap; a machine to impart motion to the elevator car; a drive unit for providing drive signals to the machine, the drive unit being sized to fit within the gap between the elevator car and the hoistway wall; and a battery for providing DC power to the drive unit.

Other aspects, features, and techniques of embodiments of the invention will become more apparent from the following description taken in conjunction with the drawings.

BRIEF DESCRIPTION OF THE DRAWINGS

Referring now to the drawings wherein like elements are numbered alike in the FIGURES.

DETAILED DESCRIPTION

Figure 1:
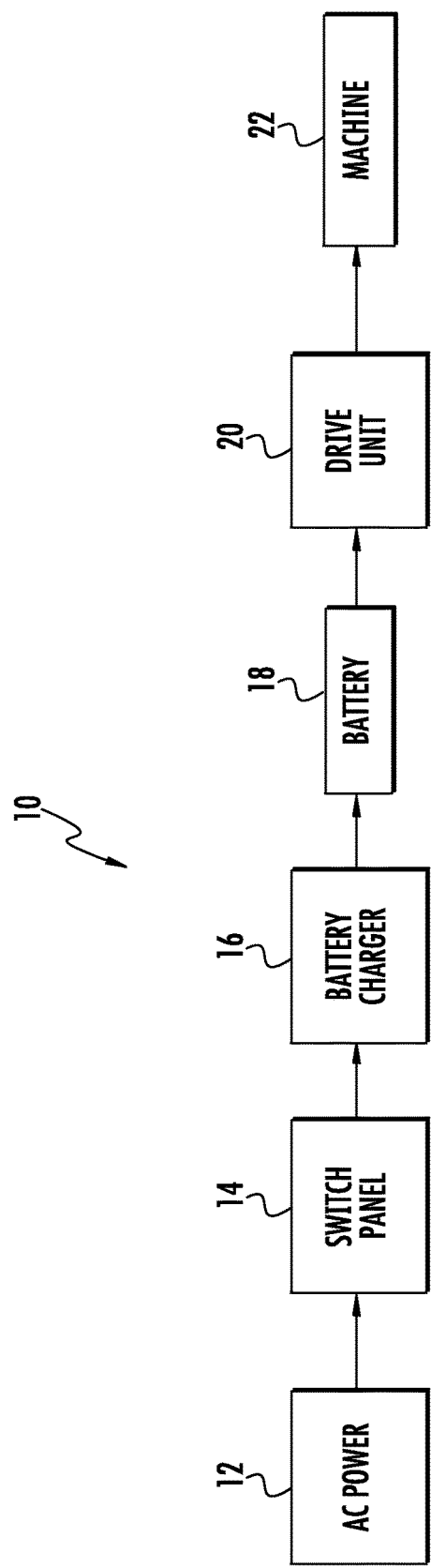
FIG. 1 is a block diagram of components of elevator system in an exemplary embodiment.

FIG. 1 is a block diagram of components of an elevator system 10 in an exemplary embodiment. Elevator system 10 includes a source of AC power 12, such as an electrical main line (e.g., 230 volt, single phase). The AC power 12 is provided to a switch panel 14, which may include circuit breakers, meters, etc. From the switch panel 14, AC power is provided to a battery charger 16, which converts the AC power to DC power to charge battery 18. Battery 18 powers drive unit 20, and may be a lead-acid battery or other type of battery. Drive unit 20 includes a control circuit board and a power circuit board, as described in further detail herein. The power circuit board converts DC power from battery 18 to AC drive signals, which drive machine 22. The AC drive signals may be multiphase (e.g., three-phase) drive signals for a three-phase motor in machine 22. It is noted that battery 18 is the sole power source to the drive unit 20, and the AC power 12 is not directly coupled to the drive unit 20.

Figure 2:
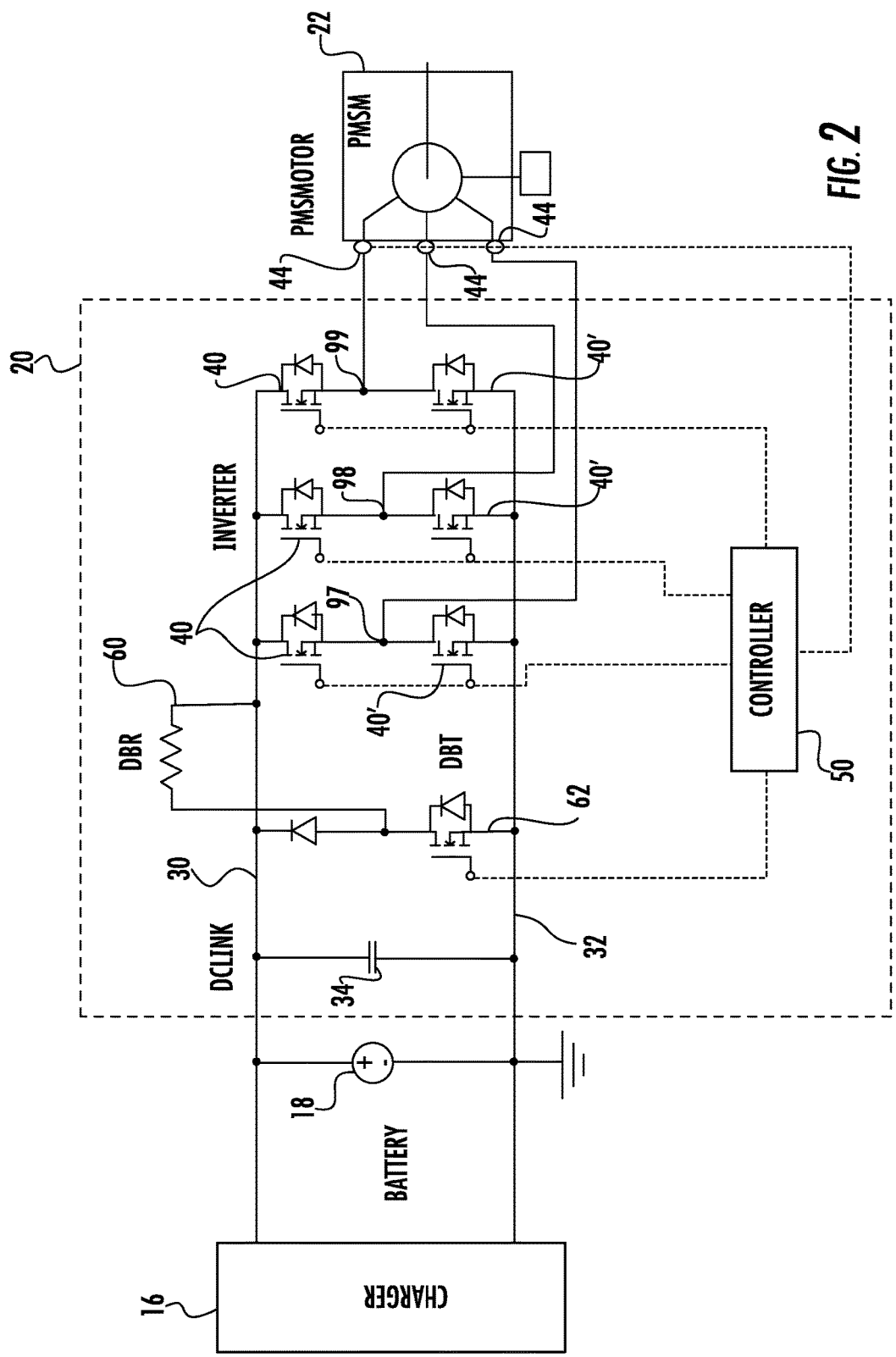
FIG. 2 depicts components of elevator system in an exemplary embodiment.

FIG. 2 depicts components of elevator system 10 in an exemplary embodiment. Drive unit 20 includes a first DC link 30 coupled to battery 18 (e.g., a positive DC voltage) and a second DC link 32 coupled to battery 18 (e.g., a negative DC voltage or ground). One or more DC link capacitors 34 are connected between the first DC link 30 and second DC link 32. An inverter section uses switches 40-40' to generate drive signals for machine 22. Switches 40 are coupled to the first DC link 30 and switches 40' are coupled to the second DC link 32. Switches 40-40' may be MOSFET transistors, but it is understood other switch types may be used. Switches 40-40' are arranged in phase legs, each phase leg connected between the first DC link 30 and second DC link 32. An AC terminal 97, 98 and 99 is provided at a junction (e.g., source-drain junction) of the switches 40-40' in each phase leg. AC terminals 97-99 are coupled to motor windings of machine 22. In an exemplary embodiment, machine 22 includes a three-phase, permanent magnet synchronous motor. FIG. 2 depicts a three-phase inverter and three-phase motor, but embodiments are not limited to a particular number of phases.

The drive unit 20 operates as a converter which can convert DC power from battery 18 to AC power for driving machine 22 in motoring mode. Drive unit 20 can also convert AC power from machine 22 to DC power for charging battery 18 when operating in regenerative mode. As known in the art, elevator system 10 uses machine 22 to produce AC power in a regenerative mode. Regenerative mode may occur when an empty elevator car is traveling upwards or when a loaded elevator car is traveling downwards. Regenerative mode may include a regenerative brake of machine 22 providing AC power. The AC power received at AC terminals 97-99 is converted to DC power to charge battery 18.

During motoring mode, controller 50 provides control signals to turn switches 40-40' on and off to generate an AC drive signal at each AC terminal 97-99. The AC drive signal may be a variable frequency signal. During regenerative mode, controller 50 provides control signals to turn switches 40-40' on and off to convert AC power from machine 22 to DC power for charging battery 18. Current sensors 44 are provided at each AC terminal 97-99 to allow controller 50 to detect current at each AC terminal 97-99, in both motoring mode and regenerative mode. Controller 50 may be implemented using a general-purpose microprocessor executing a computer program stored on a storage medium to perform the operations described herein. Alternatively, controller 50 may be implemented in hardware (e.g., ASIC, FPGA, etc.) or in a combination of hardware/software. Controller 50 may also be part of an elevator control system.

Drive unit 20 also includes a dynamic braking resistor 60 and a dynamic braking switch 62. Dynamic braking switch 62 may be a MOSFET transistor, but it is understood that other switch types may be used. In regenerative mode, if the current produced at machine 22 is excessive, the dynamic braking switch 62 is turned on (e.g., pulsed on and off) and current flows through dynamic braking resistor 60. Excess current is dissipated through the dynamic braking resistor 60. It is understood that multiple dynamic braking resistors 60 and a dynamic braking switches 62 may be employed in drive unit 20. The dynamic braking resistor 60 and a dynamic braking switch 62 may not be needed, depending on the type of battery 18. For example, a lead-acid battery 18 may not be able to digest all the current generated in regenerative mode, resulting in a need for a dynamic braking resistor 60 and a dynamic braking switch 62. A lithium-ion battery may be able to digest all the current generated in regenerative mode, eliminating the need for a dynamic braking resistor 60 and a dynamic braking switch 62.

Figure 3:
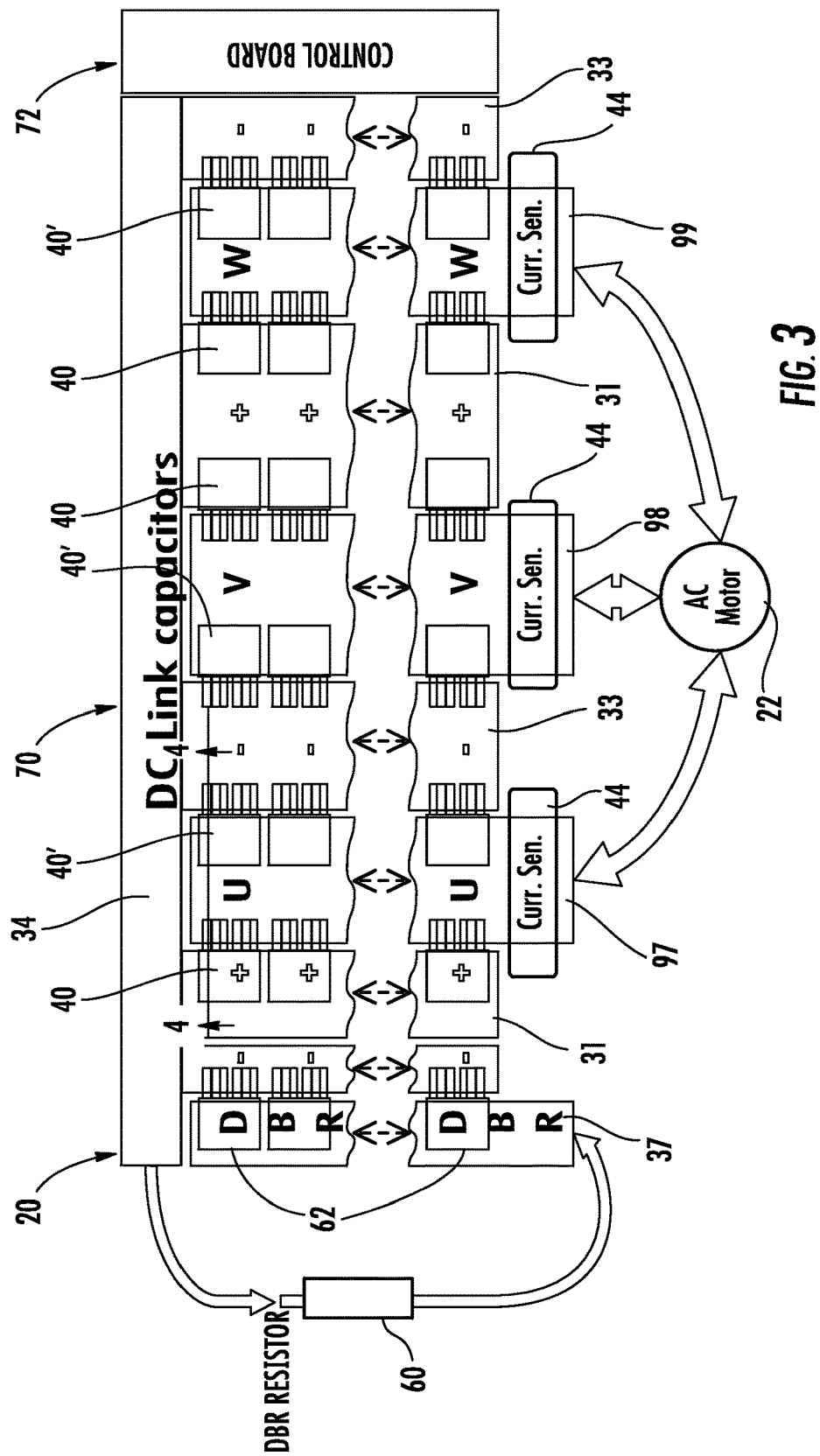
FIG. 3 depicts components of a drive unit in an exemplary embodiment.
Figure 4:
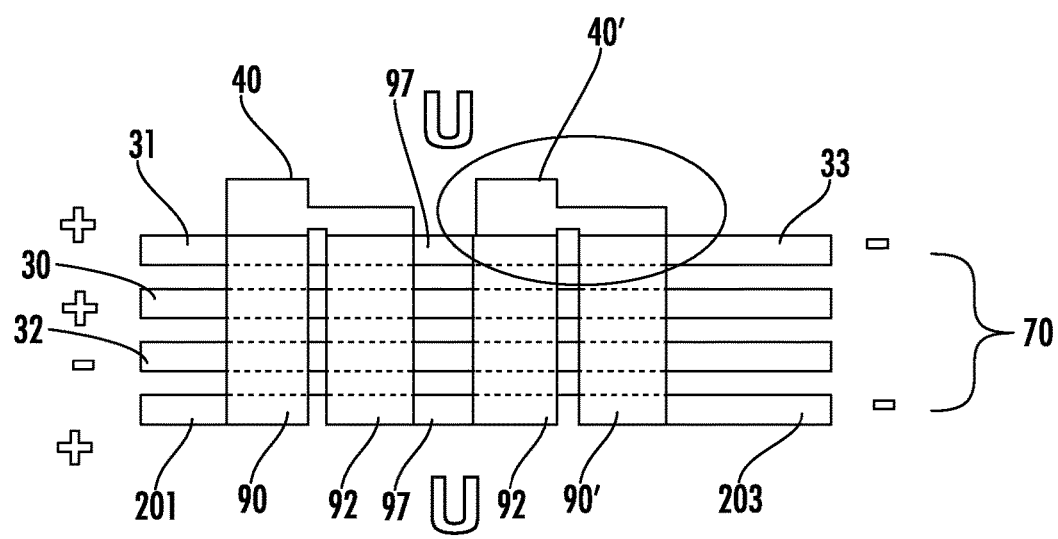
FIG. 4 is a cross-sectional view taken along line 4-4 of FIG. 3.

FIG. 3 depicts components of drive unit 20 in an exemplary embodiment. A power circuit board 70 is a multilayer printed circuit board supporting certain components of the drive unit 20. FIG. 4 is a cross-sectional view taken along line 4-4 of FIG. 3. As shown in FIGS. 3 and 4, power circuit board 70 supports first and second DC links 30 and 32, switches 40-40', AC terminals 97-99, current sensors 44, DC link capacitors 34, dynamic braking resistor(s) 60 and one or more dynamic braking switches 62. A control circuit board 72 supports controller 50, and associated components, such as safety logic, communications ports, etc. Control board 72 is shown next to power circuit board 70, but is understood that other mounting arrangements may be employed.

As shown in FIG. 3, switches 40-40' are arranged in three phase legs, labeled U, V and W. An AC terminal 97-99 is associated with each of the phase legs and is connected to machine 22. Each phase leg may employ more than the two switches 40-40' shown in FIG. 2. As shown in FIGS. 3 and 4, phase leg U includes a plurality of switches 40 in parallel connected to the first DC link 30 through first DC bus bar 31 on a top layer of power circuit board 70. Phase leg U includes a plurality of switches 40' in parallel connected to the second DC link 32 through second DC bus bar 33 on a top layer of power circuit board 70. Phase legs V and W are similarly constructed. To increase power capacity of the inverter, the groups of switches 40-40' can be expanded by extending bus bars 31 and 33 and adding another row of switches 40-40' to the power circuit board 70.

Power circuit board 70 is designed to have a low profile, allowing the drive unit 20 to be mounted in narrow spaces, as described in further detail herein. FIG. 4 is a cross-sectional view taken along line 4-4 of FIG. 3. As shown in FIG. 4, the first DC link 30 and second DC link 32 are formed as internal, conductive layers (e.g., copper) within the multilayer, power circuit board 70. The layers forming first DC link 30 and second DC link 32 may not be co-planar. AC terminals 97-99 are also formed as layers within the multilayer, power circuit board 70. The layers forming AC terminals 97-99 may be coplanar. Switches 40-40' are mounted on top of the multilayer, power circuit board 70. Vias 90-90' are formed through the power circuit board 70 to provide for connections between layers. FIG. 4 depicts first DC bus bar 31 connected to first DC link layer 30 through via 90. FIG. 4 depicts a second DC bus bar 33 connected to second DC link layer 32 through via 90'. First DC bus bar 31 may be co-planar with second DC bus bar 33.

Figure 5:
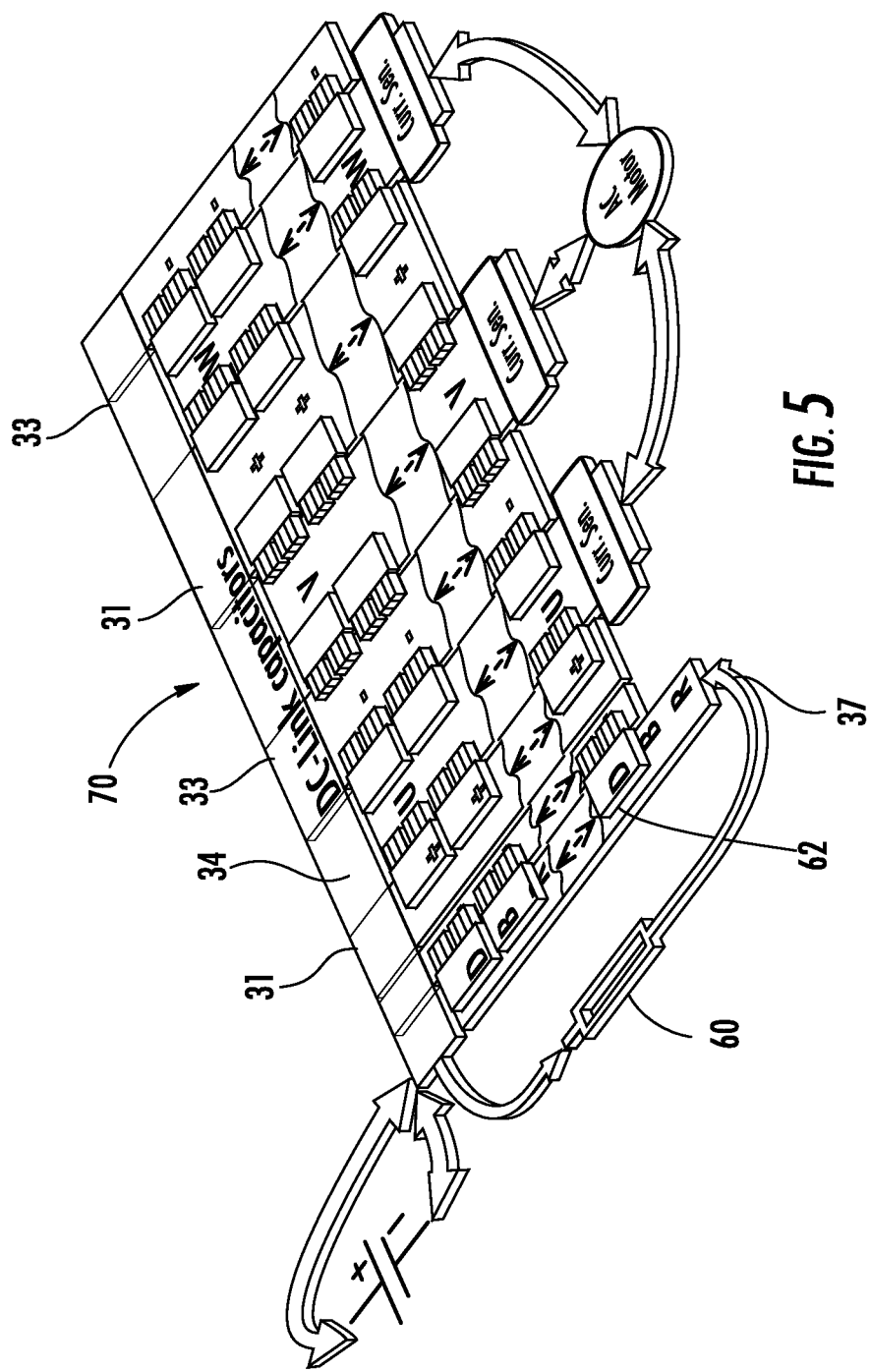
FIG. 5 is a perspective view of a power circuit board in an exemplary embodiment.

Switch 40 of FIG. 4 has a terminal connected (e.g., soldered) to first DC bus bar 31. Switch 40' of FIG. 4 has a terminal connected (e.g., soldered) to second DC bus bar 33. The junction between switch 40 and switch 40' (i.e., the source of switch 40 and the drain of switch 40') is connected to the AC terminal 97 though vias 92. Dynamic braking switches 62 have a source terminal connected to the second DC link 32 by a via through power circuit board 70. A dynamic braking bus bar 37 may be formed on a top surface of the power circuit board 70 as shown in FIG. 5. Dynamic braking switches 62 have a drain terminal connected to a dynamic braking bus bar 37. Dynamic braking bus bar 37 may be connected to the dynamic braking resistor 60 through power circuit board 70.

Also shown in FIG. 4 are electrically and thermally conductive (e.g., copper) layers 201 and 203 on the bottom of power circuit board 70. Bottom layer 201 is electrically and thermally connected to the first DC link 30 and first DC bus bar 31 by via 90. Bottom layer 203 is electrically and thermally connected to the second DC link 32 and second DC bus bar 33 by via 90'. The bottom layers 201 and 203 provide increased thermal spreading to enlarge the cooling capability. In addition, bottom layers 201 and 203 increase the amount of electrically conductive material, which allows for high current flow.

In exemplary embodiments, a heat sink may be mounted at the bottom side of the power circuit board 70, in thermal communication with one or more of first bottom layer 201, terminal 97 and second bottom layer 203. Thermal connectivity between the heat sink and one or more of first bottom layer 201, terminal 97 and second bottom layer 203 may be provided by an thermally conductive medium such as an electrically insulated thermo-transfer glue foil. Additionally, components (e.g., switches 40 and 40') may be mounted on the bottom surface of the power circuit board 70 to increase current capability.

Power circuit board 70 does not require a heat sink, which results in a low profile design. Heat from switches 40-40' (and other components) is dissipated through power circuit board 70 along vias 90, 92, etc. Vias 90 and 92 may be formed by copper tubes, either hollow or filled with a thermally conductive material. The first and second DC link layers 30 and 32 and bottom layers 201 and 203 serve as heat spreaders, to dissipate heat over the entire power circuit board 70. Vias 90 and 92 serve as electrical connections, as well as thermal connections. It is understood that additional vias may be used solely for conducting heat through power circuit board 70. Additional heat spreaders (e.g., thermally conductive layers) may also be included within power circuit board 70 to improve thermal distribution.

FIG. 5 is a perspective view of a power circuit board 70 in an exemplary embodiment. Evident in FIG. 5 is the extension of the first DC bus bar 30 and the second DC bus bar 33 to a section of the board 70 where DC link capacitors 34 are positioned. The DC link capacitors 34 may be surface mount devices mounted on a top surface of power circuit board 70 and connected to bus bars 31 and 33. As described above, vias through the multilayer power circuit board 70 are used to connect the DC link capacitors 34 to the first DC link 30 layer and the second DC link 32 layer.

Figure 6:
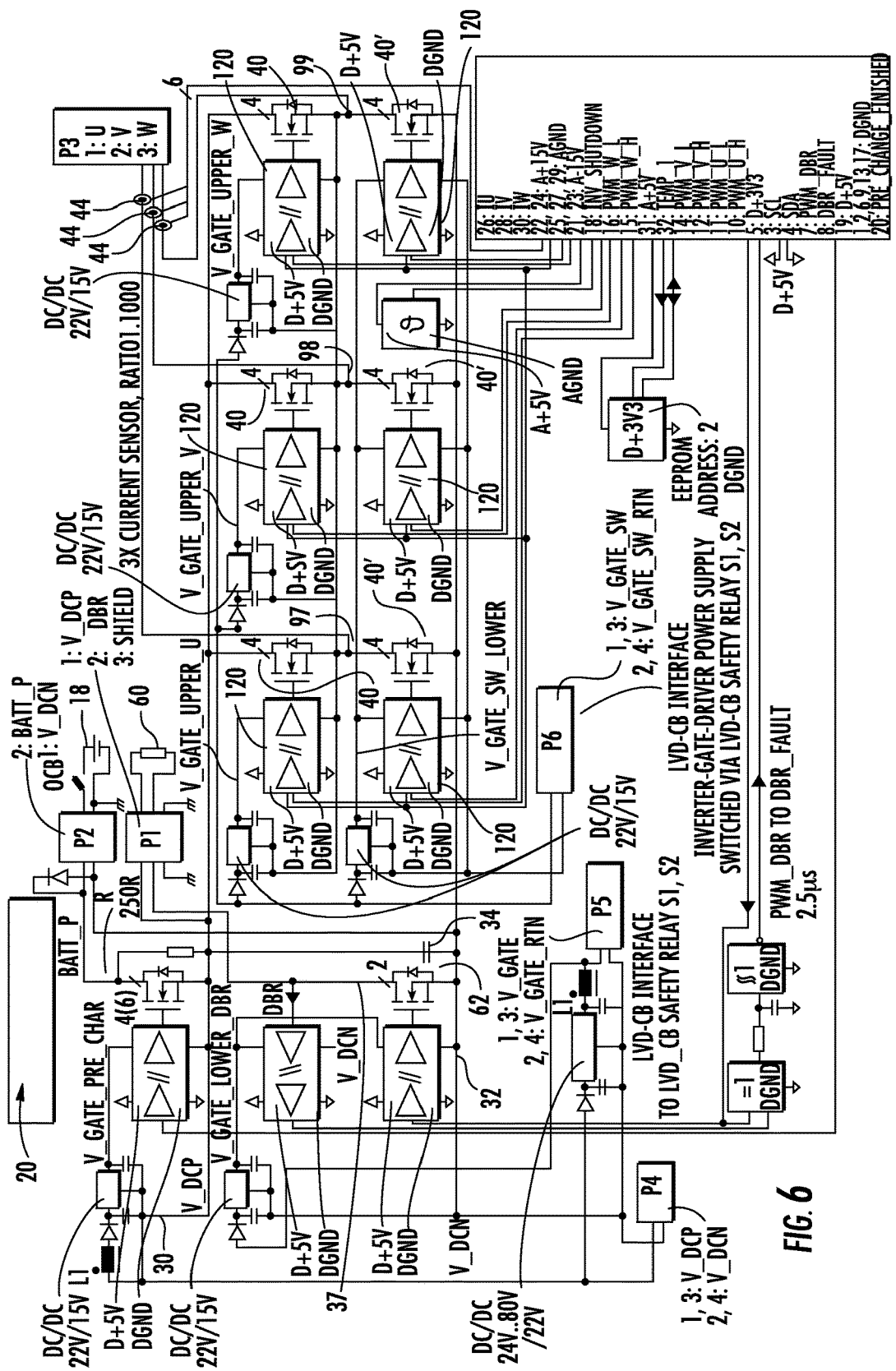
FIG. 6 is a schematic diagram of a drive unit in an exemplary embodiment.

FIG. 6 is a schematic diagram of a drive unit 20 in an exemplary embodiment. Elements in FIG. 6 corresponding to those in FIG. 2 are labeled with the same reference numerals. Shown in FIG. 6 are gate drivers 120 coupled to the gates of switches 40 and 40' to turn the switches on and off in response to control signals from controller 50.

Figure 7:
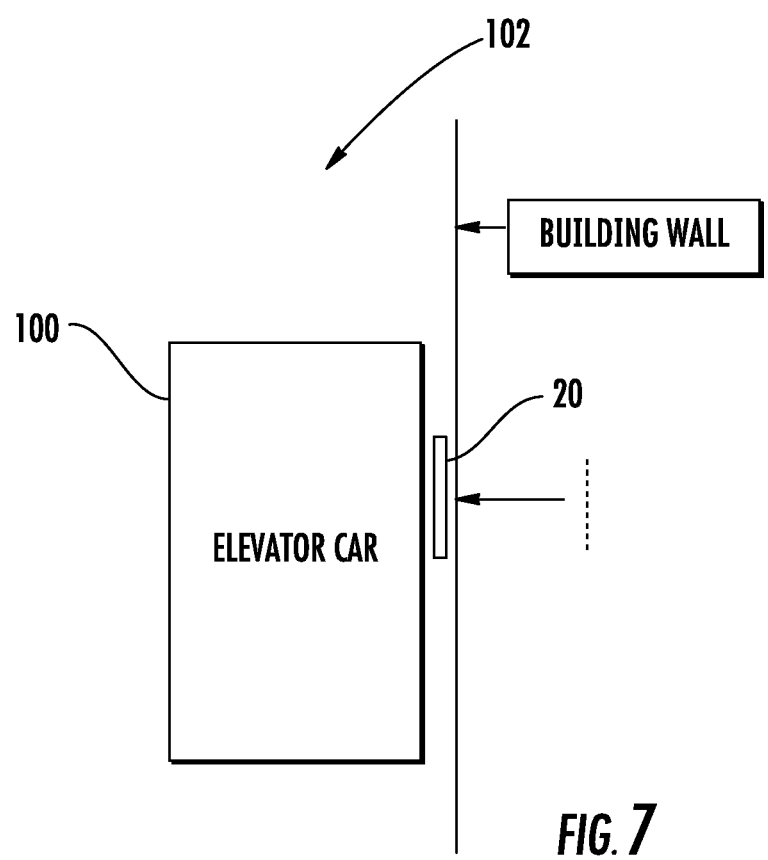
FIG. 7 depicts mounting of a drive unit in an exemplary embodiment.

FIG. 7 depicts mounting of a drive unit 20 in an exemplary embodiment. Shown in FIG. 7 is an elevator car 100 that travels in a hoistway 102, located behind a building wall. Drive unit 20 is mounted in a gap within hoistway 102 between the hoistway wall and the elevator car 100.

Embodiments provide a low profile power circuit board that does not require a heat sink. This allows the drive unit to be mounted in narrow areas, such as a gap between an elevator car and a hoistway wall. The drive unit is expandable to increase power capacity by extending bus bars 31 and 33 and adding additional rows of switches 40-40' to the power circuit board 70 without extending the height of the drive unit. This expandability allows for the exemplary drive units disclosed herein to be deployed inside hoistways even with expanded power capacity. By limiting the height of the drive unit, the disclosed drive units can be positioned in places where traditional drive units could not be placed due to the tight tolerances in many hoistways. This allows for more adaptability and decreased costs.

The terminology used herein is for the purpose of describing particular embodiments only and is not intended to be limiting of the invention. While the description of the present invention has been presented for purposes of illustration and description, it is not intended to be exhaustive or limited to the invention in the form disclosed. Many modifications, variations, alterations, substitutions, or equivalent arrangement not hereto described will be apparent to those of ordinary skill in the art without departing from the scope and spirit of the invention. Additionally, while the various embodiments of the invention have been described, it is to be understood that aspects of the invention may include only some of the described embodiments. Accordingly, the invention is not to be seen as being limited by the foregoing description, but is only limited by the scope of the appended claims.

The invention claimed is:

1. A drive unit for an elevator system, the drive unit comprising:
   a multilayer, power circuit board;
   a first DC link formed in a layer of the power circuit board;
   a second DC link formed in a layer of the power circuit board;
   a first switch having a first terminal, the first switch mounted to a surface of the power circuit board;
   a first via electrically coupling the first terminal to the first DC link;
   a second switch having a second terminal, the second switch mounted to the surface of the power circuit board; and
   a second via electrically coupling the second terminal to the second DC link;
   the first via conducting heat from the first switch to the first DC link;
   the second via conducting heat from the second switch to the second DC link.

2. The drive unit of claim 1 further comprising:
   a first DC bus bar formed in the power circuit board, the first terminal connected to the first DC bus bar, the first via connecting the first DC bus bar and the first DC link; and
   a second DC bus bar formed in the power circuit board, the second terminal connected to the second DC bus bar, the second via connecting the second DC bus bar and the second DC link.

3. The drive unit of claim 2 further comprising:
   a DC link capacitor having a first terminal connected to the first DC bus bar and a second terminal connected to the second DC bus bar.

4. The drive unit of claim 2 wherein:
   the first DC bus bar and the second DC bus bar are extendable to increase power capacity of the drive unit.

5. The drive unit of claim 2 further comprising:
   a dynamic braking resistor and a dynamic braking switch mounted to the power circuit board.

6. The drive unit of claim 5 wherein:
   the dynamic braking switch has a terminal electrically connected to the second DC link and the dynamic braking resistor has a terminal electrically connected to the first DC link.

7. The drive unit of claim 1 further comprising:
   an AC terminal formed at an electrical junction of the first switch and the second switch, the AC terminal formed in at least one layer of the power circuit board.

8. The drive unit of claim 7 further comprising:
   a current sensor positioned adjacent the AC terminal.

9. The drive unit of claim 7 further comprising:
   an second AC terminal formed at an electrical junction of a third switch and a fourth switch, the second AC terminal formed in at least one layer of the power circuit board, the first AC terminal and second AC terminal being co-planar.

10. The drive unit of claim 1 further comprising:
    a control board supporting a controller, the controller providing control signals to the first switch and second switch.

11. The drive unit of claim 1 wherein:
    the first DC link formed is not co-planar with the second DC link.

12. The drive unit of claim 2 wherein:
    the first DC bus bar is co-planar with the second DC bus bar.

13. The drive unit of claim 1 wherein:
    the power circuit board includes a first bottom layer and a second bottom layer;
    the first via conducting heat from the first switch to the first bottom layer;
    the second via conducting heat from the second switch to the second bottom layer.

14. An elevator system comprising:
    an elevator car to travel along a hoistway, the elevator car distanced from a hoistway wall by a gap;
    a machine to impart motion to the elevator car;
    a drive unit for providing drive signals to the machine, the drive unit being sized to fit within the gap between the elevator car and the hoistway wall; and
    a battery for providing DC power to the drive unit;
    wherein:
    the drive unit includes:
      a multilayer, power circuit board;
      a first DC link formed in a layer of the power circuit board;
      a second DC link formed in a layer of the power circuit board;
      a first switch having a first terminal, the first switch mounted to a surface of the power circuit board;
      a first via electrically coupling the first terminal to the first DC link;

a second switch having a second terminal, the second switch mounted to the surface of the power circuit board; and
a second via electrically coupling the second terminal to the second DC link;
the first via conducting heat from the first switch to the first DC link;
the second via conducting heat from the second switch to the second DC link.

15. The elevator system of claim 14 further comprising:
a first DC bus bar formed in the power circuit board, the first terminal connected to the first DC bus bar, the first via connecting the first DC bus bar and the first DC link; and
a second DC bus bar formed in the power circuit board, the second terminal connected to the second DC bus bar, the second via connecting the second DC bus bar and the second DC link.

16. The elevator system of claim 15 further comprising:
a DC link capacitor having a first terminal connected to the first DC bus bar and a second terminal connected to the second DC bus bar.

17. The elevator system of claim 15 wherein:
the first DC bus bar and the second DC bus bar are extendable to increase power capacity of the drive unit.

18. The elevator system of claim 15 further comprising:
a dynamic braking resistor and a dynamic braking switch mounted to the power circuit board.

19. The elevator system of claim 18 wherein:
the dynamic braking switch has a terminal electrically connected to the second DC link and the dynamic braking resistor has a terminal electrically connected to the first DC link.

20. The elevator system of claim 14 further comprising:
an AC terminal formed at an electrical junction of the first switch and the second switch, the AC terminal formed in at least one layer of the power circuit board.

21. The elevator system of claim 20 further comprising:
a current sensor positioned adjacent the AC terminal.

22. The elevator system of claim 20 further comprising:
an second AC terminal formed at an electrical junction of a third switch and a fourth switch, the second AC terminal formed in at least one layer of the power circuit board, the first AC terminal and second AC terminal being co-planar.

23. The elevator system of claim 14 further comprising:
a control board supporting a controller, the controller providing control signals to the first switch and second switch.

24. The elevator system of claim 14 wherein:
the first DC link formed is not co-planar with the second DC link.

25. The elevator system of claim 15 wherein:
the first DC bus bar is co-planar with the second DC bus bar.

26. The elevator system of claim 14 wherein:
the power circuit board includes a first bottom layer and a second bottom layer;
the first via conducting heat from the first switch to the first bottom layer;
the second via conducting heat from the second switch to the second bottom layer.

* * * * *